(12) United States Patent
Park et al.

(10) Patent No.: US 7,787,302 B2
(45) Date of Patent: Aug. 31, 2010

(54) FLASH MEMORY DEVICE, METHOD OF MANUFACTURING THE SAME, AND METHOD OF OPERATING THE SAME

(75) Inventors: Sung-Il Park, Yongin-si (KR); Sung-Hoon Lee, Yongin-si (KR); Kwang-Soo Seol, Yongin-si (KR); Young-Gu Jin, Yongin-si (KR); Jong-Seob Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 146 days.

(21) Appl. No.: 12/073,681

(22) Filed: Mar. 7, 2008

(65) Prior Publication Data
US 2008/0285353 A1  Nov. 20, 2008

(30) Foreign Application Priority Data
May 17, 2007  (KR) ............... 10-2007-0048311

(51) Int. Cl.
*G11C 16/04*  (2006.01)
(52) U.S. Cl. ............... 365/185.18; 365/185.19; 365/185.22; 365/185.24
(58) Field of Classification Search ............ 365/185.18, 365/185.12, 185.03, 185.19, 185.22, 185.24
See application file for complete search history.

(56) References Cited

U.S. PATENT DOCUMENTS

| 5,218,554 | A  | * | 6/1993 | Slocum | 702/50 |
| 7,130,215 | B2 | * | 10/2006 | Yeh | 365/185.01 |
| 7,342,827 | B2 | * | 3/2008 | Park et al. | 365/185.12 |
| 2007/0232041 | A1 | * | 10/2007 | Choi et al. | 438/585 |

* cited by examiner

*Primary Examiner*—Pho M. Luu
(74) *Attorney, Agent, or Firm*—Harness, Dickey & Pierce, P.L.C.

(57) ABSTRACT

Provided are a memory device, a method of manufacturing the same, and a method of operating the same. The memory device may include a channel region having an upper end where both sides of the upper end are curved, the curved portions of both sides allowing charges to be injected thereinto in a program or erase voltage such that the curved portions into which the charges are injected are separate from a portion which determines a threshold voltage, and a gate structure on the channel region.

24 Claims, 16 Drawing Sheets
(2 of 16 Drawing Sheet(s) Filed in Color)

FLASH MEMORY DEVICE, METHOD OF MANUFACTURING THE SAME, AND METHOD OF OPERATING THE SAME

PRIORITY STATEMENT

This application claims priority under 35 U.S.C. §119 to Korean Patent Application No. 10-2007-0048311, filed on May 17, 2007, in the Korean Intellectual Property Office (KIPO), the entire contents of which are incorporated herein by reference.

BACKGROUND

1. Field

Example embodiments relate to a flash memory device, and methods of manufacturing and operating the same. Other example embodiments relate to a flash memory device that may offset undesirable reliability due to degradation of a portion into which electrons or holes are injected, and methods of manufacturing and operating the flash memory device.

2. Description of the Related Art

Non-volatile memory devices are semiconductor memory devices that may preserve stored data even when there is no supply of power. Representative non-volatile memory devices may be flash memory devices. Each of a plurality of memory cells constituting flash memory may include a cell transistor having a gate structure in which a floating gate storing charges, e.g., data, and a control gate controlling the floating gate may be sequentially stacked. Program or erase operations may be performed in the cell transistor using the Fowler-Nordheim (F-N) tunnelling mechanism.

In order to satisfy the demand for expanding the memory capacity of the flash memory device, the size of the memory cells has been reduced. Also, according to the reduction in the size of the memory cells, a height of the floating gate in a vertical direction may be reduced. However, the size of the floating gate may limit the reduction in the size of the flash memory device. In order to deal with this limitation, a charge trap flash (CTF) memory device including a charge trap layer instead of a floating gate has been developed. The CTF memory device may utilize a shifting threshold voltage as charges are trapped in the charge trap layer. The CTF memory device may be smaller than a flash memory device that stores charges in a floating gate.

FIGS. 1A and 1B are cross-sectional views illustrating the program and erase operations of a conventional CTF memory device. Referring to FIGS. 1A and 1B, a memory cell constituting the conventional CTF memory device may include a tunnel oxide layer 1 formed on a channel region 8 of a semiconductor substrate and allowing charges to tunnel therethrough, a charge trap layer 3 formed on the tunnel oxide layer 1 and allowing the charges tunneling through the tunnel oxide layer 1 to be trapped therein, a blocking oxide layer 5 formed on the charge trap layer 3 and preventing or reducing the charges passing through the charge trap layer 3 from moving upward, and a control gate 7 formed on the blocking oxide layer 5. The channel region 8 may be formed in the semiconductor substrate. In a memory cell array, a device isolating region 9 may be formed by shallow trench isolation (STI) to define the channel region 8 and electrically separate the memory cells. The tunnel oxide layer 1, the charge trap layer 3, the blocking oxide layer 5, and the control gate 7 may be formed on the channel region 8 and the device isolating region 9. The memory cell may be defined by the channel region 8.

Referring to FIG. 1A, in a program mode, a higher voltage (for example, 16V to 17V) may be applied to the control gate 7 and a lower voltage (for example, 0V) may be applied to the channel region 8. Thus, electrons may be injected from the channel region 8 into the charge trap layer 3 and then trapped in the charge trap layer 3. A lower voltage, e.g., a voltage $V_{body}$ of 0V, may be applied to the semiconductor substrate and the channel region 8.

Referring to FIG. 1B, in an erase mode, a low voltage (for example, 0V) may be applied to the control gate 7, the channel region 8 may be floated, and a high voltage (for example, a voltage $V_{body}$ of 17 to 18V) may be applied to the semiconductor substrate. Thus, the electrons stored in the charge trap layer 3 may be released from the charge trap layer 3 to the channel region 8, or removed due to recombination with holes injected into the charge trap layer 3 from the channel region 8.

As illustrated in FIG. 2, a threshold voltage may be determined at a central portion A' of the channel region 8 adjacent to the channel region 8 and the tunnel oxide layer 1. However, in the program or erase mode, electrons or holes may be injected into the central portion A', thereby degrading the tunnel oxide layer 1. As illustrated in FIG. 3, degradation of the tunnel oxide layer 1 may result from traps generated in a portion of the tunnel oxide layer 1 into which the electrons or holes are injected. Such traps may affect the channel region 8 located below and shift a programmed threshold voltage. Accordingly, when the portion into which electrons or holes are injected is degraded in the program or erase mode, the threshold voltage may be shifted, thereby degrading the reliability of the CTF memory device.

SUMMARY

Example embodiments provide a charge trap flash (CTF) memory device that has improved reliability by separating a portion into which charges are injected from a portion which determines a threshold voltage, and methods of manufacturing and operating the CTF memory device.

According to example embodiments, a memory device may include a channel region having an upper end where both sides of the upper end are curved, the curved portions of both sides allowing charges to be injected thereinto in a program or erase voltage such that the curved portions into which the charges are injected are separate from a portion which determines a threshold voltage, and a gate structure on the channel region.

The upper end of the channel region may be formed to have a convex curvature on both sides. The upper end of the channel region may be further formed to have a concave curvature in the center. Curvatures of portions having the convex curvature may be greater than a portion having the concave curvature. The gate structure may include a tunnel insulating layer, wherein the tunnel insulating layer has a portion near the concave curvature thicker than portions near the convex curvature. At least some layers constituting the gate structure may be formed to conform to the curved shape of the channel region.

The gate structure may be of a charge trap type including a tunnel insulating layer and a charge trap layer on the channel region to conform to the curved shape of the channel region, a blocking insulating layer on the charge trap layer, and a control gate on the blocking insulating layer.

According to example embodiments, a method of manufacturing a memory device may include preparing a substrate, forming a structure including a protrusion portion formed on a preliminary channel region position on the substrate and having first and second protrusions being spaced apart from each other in an upper end of the protrusion portion, and insulating material regions formed on both sides of the protrusion portion to expose the first and second protrusions, forming a channel region having an upper end, etching both sides of the upper end so that the first and second protrusions have a convex curvature, and forming a gate structure on the channel region.

Forming the structure including the protrusion portion and the insulating material regions may include forming a stepped structure on the substrate including a protrusion portion and insulating material regions which are on both sides of the protrusion portion and extend beyond the protrusion portion; etching a first hard mask layer on portions of the protrusion portion adjacent to the insulating material regions, and exposing only a central portion of the protrusion portion, forming first and second protrusions spaced apart from each other on an upper end of the protrusion portion by etching the exposed central portion of the protrusion portion to a depth; and removing the first hard mask layer, and partially removing the insulating material regions to expose outer surfaces of the first and second protrusions.

Forming the stepped structure may include forming a second hard mask layer on the substrate, forming the protrusion portion by removing portions of the second hard mask layer and the substrate other than the preliminary channel region position to a depth, forming an insulating material region on both sides of the protrusion portion so that the insulating material region extend beyond the protrusion portion to obtain a stepped structure, and exposing the stepped structure by removing the second hard mask layer. Etching the first hard mask layer may include forming a first hard mask layer on the stepped structure; and etching the first hard mask layer only on portions of the protrusion portion other than those adjacent to the insulating material regions.

According to example embodiments, a method of operating a memory device may include injecting charges into a channel region, having an upper end where both sides of the upper end are curved, by applying a program or erase voltage, and accelerating the movement of the injected charges by applying an additional voltage.

The additional voltage may be a direct current (DC) voltage or a direct current plus alternating current (DC plus AC) voltage. The additional voltage may have a magnitude less than that of the program or erase voltage. The additional voltage may have a DC polarity opposite to that of the program or erase voltage.

BRIEF DESCRIPTION OF THE DRAWINGS

The patent or application file contains at least one drawing executed in color. Copies of this patent or patent application publication with color drawings will be provided by the Office upon request and payment of the necessary fee.

Example embodiments will be more clearly understood from the following detailed description taken in conjunction with the accompanying drawings. FIGS. 1A-13K represent non-limiting, example embodiments as described herein.

FIGS. 1A and 1B are cross-sectional views illustrating the program and erase operations of a charge trap flash (CTF) flash memory device;

FIG. 2 is a cross-sectional view illustrating a portion which determines a threshold voltage in a CTF memory device;

FIG. 3 is a view for explaining degradation resulting from traps generated in a tunnel oxide layer of a CTF memory device;

FIG. 6 is illustrating the program operation of the CTF memory device according to example embodiments;

FIG. 9 is illustrating the read operation of the CTF memory device according to example embodiments;

FIGS. 13A-13K are cross-sectional views illustrating a method of manufacturing a CTF memory device according to example embodiments.

Figure 1A:
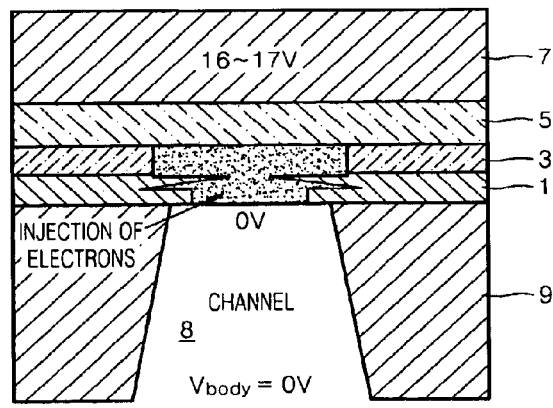
Figure 1B:
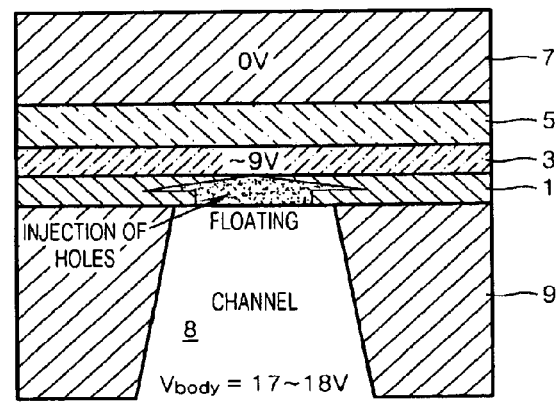
Figure 2:
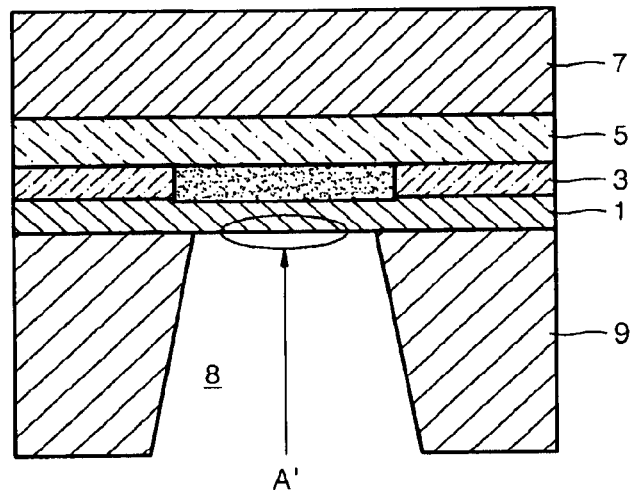
Figure 3:
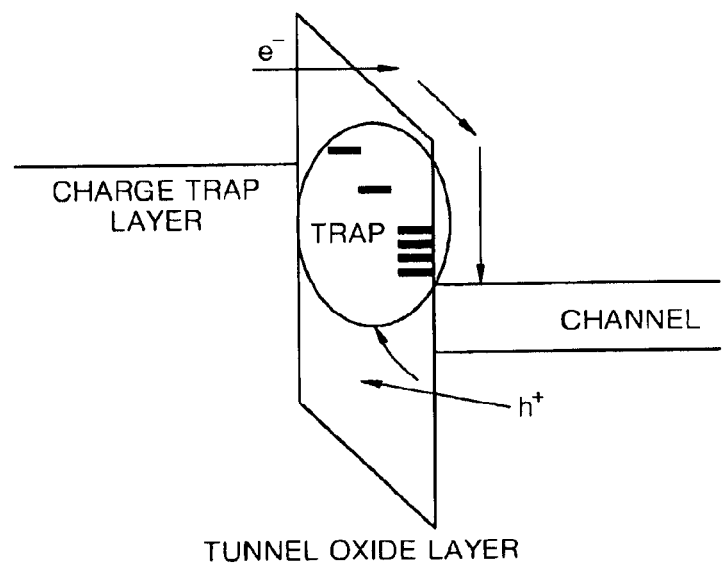

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. Example embodiments may, however, be embodied in many different forms and should not be construed as being limited to the embodiments set forth herein. Rather, these embodiments are provided so that this disclosure will be thorough and complete, and will fully convey the scope of example embodiments to those skilled in the art. In the drawings, the thickness of layers, films and regions are exaggerated for clarity. Like numbers refer to like elements throughout the specification.

It will be understood that when an element or layer is referred to as being "on", "connected to" or "coupled to"

another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4A:
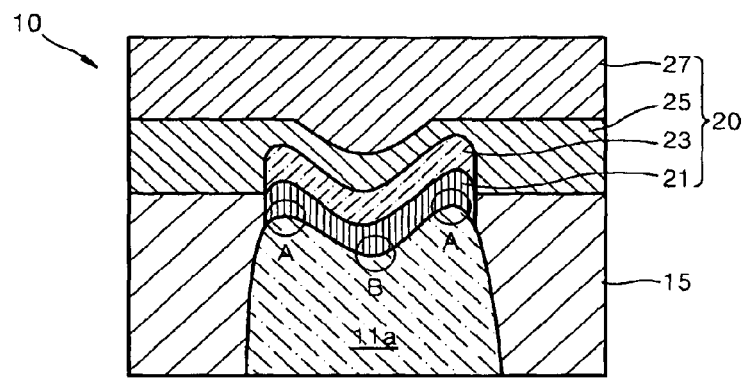
FIG. 4A is a cross-sectional view of a CTF memory device according to example embodiments.
Figure 4B:
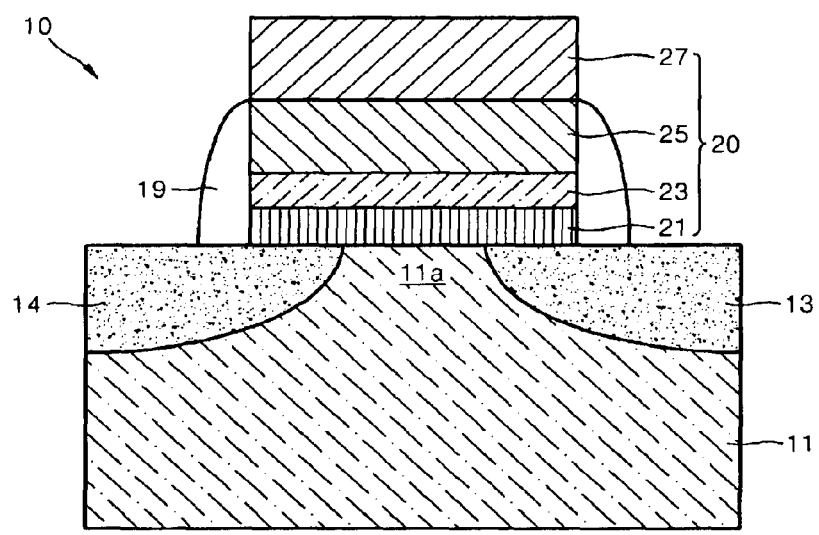
FIG. 4B is a cross-sectional view of the CTF memory device of FIG. 4A in another direction.

A flash memory device according to example embodiments may include a floating gate type flash memory device having a floating gate and a charge trap flash (CTF) memory device having a charge trap layer. The CTF memory device will now be explained as the flash memory according to example embodiments. FIG. 4A is a cross-sectional view of a CTF memory device 10 according to example embodiments. FIG. 4B is a cross-sectional view of the CTF memory device 10 of FIG. 4A viewed in another direction. In detail, FIGS. 4A and 4B illustrate one memory cell of the CTF memory device 10. When memory cells are arranged to constitute a NAND flash memory device, FIG. 4A is a cross-sectional view in a word line direction and FIG. 4B is a cross-sectional view in a bit line direction.

Referring to FIGS. 4A and 4B, the CTF memory device 10 may include a channel region 11a formed in a substrate 11 and a gate structure 20 formed on the channel region 11a. The substrate 11 is not shown in FIG. 4A. The substrate 11 may be a silicon semiconductor substrate, or a substrate obtained by forming a single crystal silicon layer on a silicon-on-insulator (SOI) substrate. The channel region 11a may have an upper end whose lateral portions at least are curved, such that the curved lateral portions may be used as regions into which charges are injected in a program or erase mode. As a result, a portion into which charges are injected and a portion which determines a threshold voltage are separated from each other. The upper end of the channel region 11a may include lateral portions A having a convex curvature in both sides and may further include a portion B having a concave curvature in the center. The convex curvature may be greater than the concave curvature.

Figure 5A:
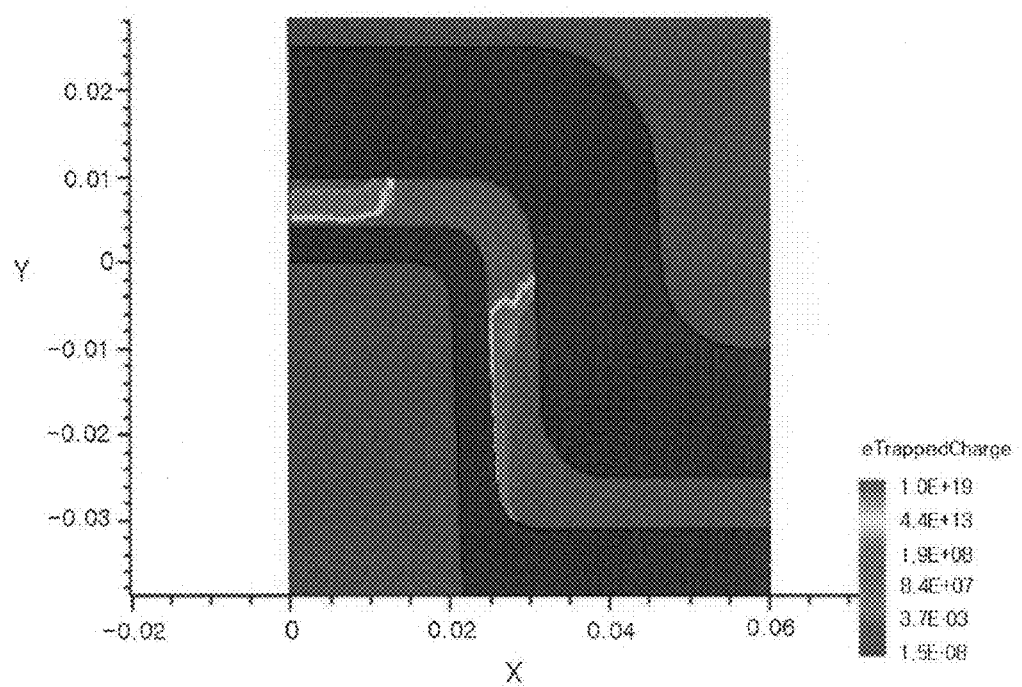
FIG. 5A is a graph illustrating the density of electrons injected into a portion having a convex curvature.
Figure 5B:
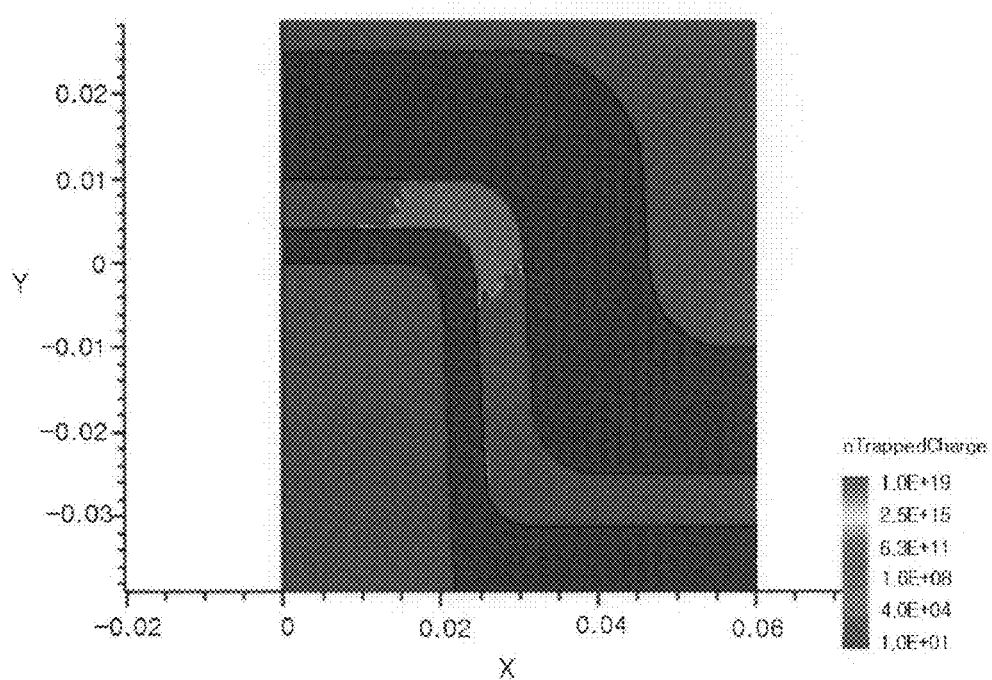
FIG. 5B is a graph illustrating the density of holes injected into the portion having the convex curvature.

FIG. 5A is a graph illustrating the density of electrons injected into a portion having a convex curvature. FIG. 5B is a graph illustrating the density of holes injected into the portion having the convex curvature. Referring to FIG. 5A, most of the electrons may be injected into the portion having the convex curvature. Referring to FIG. 5B, most of the holes may be injected into the portion having the convex curvature. Most of the electrons and holes may be injected into the portion having the convex curvature results from an increased field effect due to the convex curvature.

Accordingly, when the upper end of the channel region 11a includes the portions A having the convex curvature in both sides and the portion B having the concave curvature in the center as shown in FIG. 4A, most of the charges may be injected into the portions A having the convex curvature (referred to as charge injection regions) in both sides and a threshold voltage may be determined by the portion B having the concave curvature (referred to as the threshold voltage determination region) in the center. Accordingly, because the charge injection regions A, where degradation is generated, are separated from the threshold voltage determination region B which determines a threshold voltage, the risk of shifting a threshold voltage due to the degradation of the charge injection regions A, into which electrons or holes are injected, may be reduced, thereby improving the reliability of the CTF memory device 10 considerably.

The gate structure 20 of the CTF memory device 10 may include a tunnel insulating layer 21. The curvature of the charge injection regions A may be greater than the curvature of the threshold voltage determination region B. The tunnel insulating layer 21 may have a portion near to the threshold voltage determination region B having the concave curvature and thicker than portions nearer to the charge injection regions A having the convex curvature in order to prevent or reduce electrons from being directly released from the threshold voltage determination region B in an erase mode. For example, electrons may not be directly released from the threshold voltage determination region B in an erase mode, because the curvature of the threshold voltage determination region B may be smaller than that of the charge injection regions A and the portion of the tunnel insulating layer 21 near the threshold voltage determination region B may be relatively thick.

The gate structure 20 may include a plurality of layers. At least some of the layers constituting the gate structure 20 may conform to the curved shape of the upper end of the channel region 11a. For example, the gate structure 20 of the CTF memory device 10 may include the tunnel insulating layer 21 formed on the channel region 11a, a charge trap layer 23 formed on the tunnel insulating layer 21, a blocking insulating layer 25 formed on the charge trap layer 23, and a control gate 27 formed on the blocking insulating layer 25. The tunnel insulating layer 21 and the charge trap layer 23 may be formed on the channel region 11a to conform to the curved shape of the channel region 11a as shown in FIG. 4A.

The tunnel insulating layer 21 may allow charges, for example, electrons or holes, to tunnel therethrough. The charges tunnelling through the tunnel insulating layer 21 may be trapped in the charge trap layer 23. In a program mode, injected electrons may be trapped in the charge trap layer 23. In an erase mode, injected holes may be recombined with the electrons trapped in the charge trap layer 23. The blocking insulating layer 25 may prevent or reduce charges passing through the charge trap layer 23 from moving upward. Referring FIG. 4B, first and second impurity regions 13 and 14 doped with predetermined or given conductive impurities may be formed in the substrate 11. Any one of the first and second impurity regions 13 and 14 may be used as a drain D and the remaining one may be used as a source S. In FIG. 4B, reference numeral 19 denotes a spacer.

The tunnel insulating layer 21 may be formed on the substrate 11 to contact the first and second impurity regions 13 and 14, and to be positioned on the channel region 11a. The tunnel insulating layer 21 may be a tunnelling oxide layer formed of $SiO_2$, various high-k oxides, or a combination thereof. Alternatively, the tunnel insulating layer 21 may be a silicon nitride layer formed of $Si_3N_4$. The silicon nitride layer may be formed by jet vapor deposition to have an impurity density similar to that of a silicon oxide layer, and have increased interfacial characteristics on silicon. Alternatively, the tunnel insulating layer 21 may have a double-layer structure including a silicon nitride layer and an oxide layer.

Charges may be trapped in the charge trap layer 23 and thus data may be stored in the charge trap layer 23. The charge trap layer 23 may include any one of a nitride, a high-k dielectric substance, and nanodots. For example, the charge trap layer 23 may be formed of a nitride, e.g., $Si_3N_4$ or a high-k oxide, for example, $SiO_2$, $HfO_2$, $ZrO_2$, $Al_2O_3$, HfSiON, HfON, or HfAlO. The charge trap layer 23 may include a plurality of discontinuously arranged nanodots as a charge trap site. The nanodots may be nanocrystalline. The blocking insulating layer 25, which prevents or reduces charges passing through the charge trap layer 23 from moving toward the control gate 27, may be an oxide layer.

The blocking insulating layer 25 may be formed of $SiO_2$, or a high-k material having a dielectric constant higher than that of the tunnel insulating layer 21, for example, $Si_3N_4$, $Al_2O_3$, $HfO_2$, $Ta_2O_5$, or $ZrO_2$. The blocking insulating layer 25 may have a multi-layer structure. For example, the blocking insulating layer 25 may have a double or more multi-layer structure including an insulating layer formed of a general insulating material, e.g., $SiO_2$, and a high-k dielectric layer formed of a material having a dielectric constant higher than that of the tunnel insulating layer 21. The control gate 27 may be a metal layer. For example, the control gate 27 may be formed of aluminum (Al). Alternatively, the control gate 27 may be formed of a metal, e.g., Ru or TaN, or a silicide, e.g., NiSi, which are typically used for a gate electrode of a semiconductor memory device. The channel region 11a formed in the semiconductor substrate 11 may be defined by device isolating regions 15 formed by shallow trench isolation (STI) that electrically separates the memory cells.

FIG. 4A illustrates that the CTF memory device 10 may include the channel region 11a defined by the device isolating regions 15, the tunnel insulating layer 21 and the charge trap layer 23 formed on the channel region 11a to conform to the curved shape of the channel region 11a, and the blocking insulating layer 25 and the control gate 27 formed across the charge trap layer 23 and the device isolating regions 15. The CTF memory device 10 may control a hole injection region according to the curvatures of the channel region 11a, the tunnel insulating layer 21, and the charge trap layer 23. As a result, because the charge injection regions A and the threshold voltage determination region B are separated from each other, a shift in a threshold voltage due to degradation of the tunnel insulating layer 21 may be avoided, thereby preventing or reducing reliability degradation of the CTF memory device 10.

Figure 6:
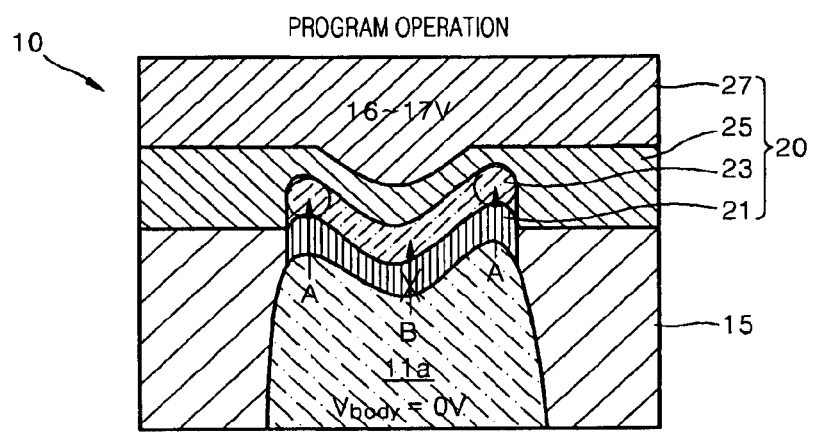

FIG. 6 is illustrating the program operation of the CTF memory device according to example embodiments. Referring to FIG. 6, during program operation, a relatively high voltage (for example, about 16V-about 17V) may be applied to the control gate 27, and the substrate 11 may be kept in a state of $V_{body}=0V$. Due to a relatively high field effect caused by the curvature, during program operation, most of the electrons may be injected into the charge injection regions A having the convex curvature while electrons may not be injected into the threshold voltage determination region B due to inverse curvature. The electron injection regions A and the threshold voltage determination region B may be spatially separated from each other.

Figure 7A:
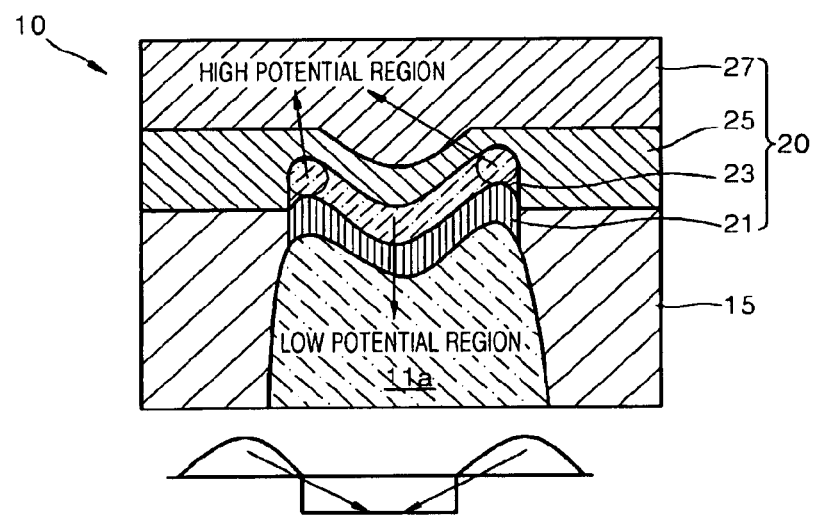
FIG. 7A is illustrating a state that electrons are injected into a charge trap layer during the program operation and a potential therefrom.
Figure 7B:
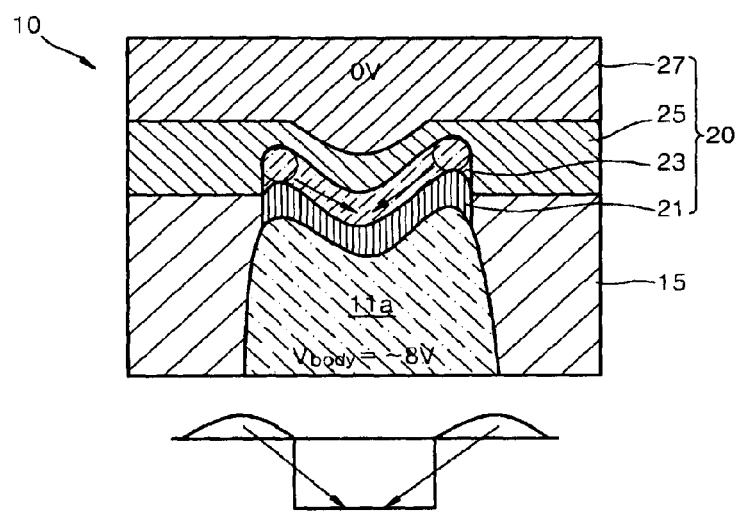
FIG. 7B is illustrating movement of electrons and change of a potential when an additional voltage is applied to the CTF memory device that the electrons are injected into the charge trap layer by the program operation of FIG. 7A.

FIG. 7A illustrates a state where electrons are injected into the charge trap layer 23 during the program operation and a potential therefrom. FIG. 7B is illustrating movement of electrons and change of a potential when an additional voltage is applied to the CTF device 10 and the electrons are injected into the charge trap layer 13. Because most of the electrons are injected into the charge injection regions A having the convex curvature formed on both sides of the channel region 11a, both side portions of the charge trap layer 23 may become a higher potential regions and a central portion of the charge trap layer 23 may become a lower potential region. The lower figure of FIG. 7A illustrates the lateral potential profile of the charge trap layer 23.

The electrons may be moved to the central portion of the charge trap layer 23 due to the difference in potential, thereby changing a threshold voltage. According to the program method of example embodiments, after the electrons are injected as described above, an additional bias voltage having a polarity opposite to that of a program voltage may be applied. The additional voltage may accelerate the movement of the injected electrons in the charge trap layer 23. The additional voltage may be a body bias direct current (DC) or direct current plus alternating current (AC) voltage less than the program voltage. The additional voltage may have DC polarity opposite to the program voltage.

FIG. 7B illustrates where the control gate 27 is kept in a state of about 0V, and a body bias voltage of about 8V, for example, $V_{body}=\sim 8V$, is applied to the substrate 11. When the additional voltage is applied in this way, the difference in potential charges between a higher electron density region and a lower electron density region may be further increased as shown in the lower figure of FIG. 7B, thereby accelerating the movement of the electrons.

Accordingly, the additional voltage increases a driving force with respect to the movement of the electrons, thereby moving the electrons. For example, when a DC plus AC bias voltage is applied, the drift mobility of the electrons may be increased, thereby facilitating the movement of the electrons.

Figure 8A:
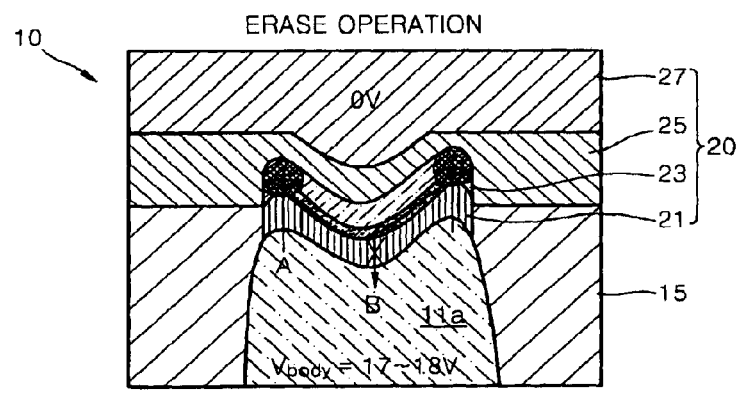
FIG. 8A is illustrating the erase operation of the CTF memory device according to example embodiments.
Figure 8B:
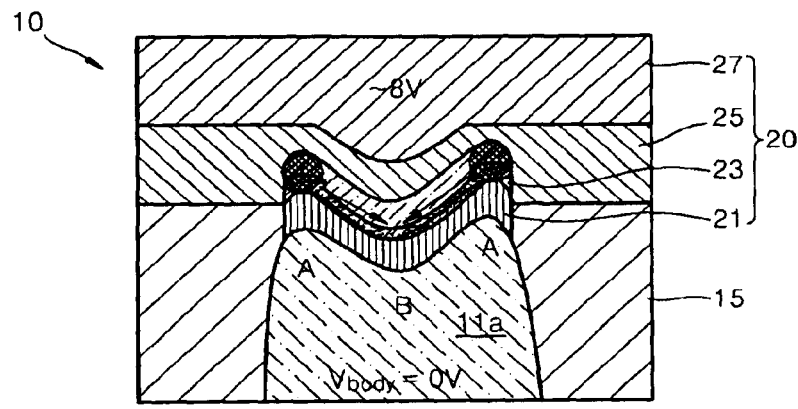
FIG. 8B is illustrating movement of holes when an additional voltage is applied to the CTF memory device that holes are injected into the charge trap layer by the erasure operation of FIG. 8A.

FIG. 8A is illustrating the erase operation of the CTF memory device 10 according to example embodiments. FIG. 8B illustrates that holes, which are injected into the charge trap layer 23 by the erase operation of FIG. 8A, are moved when an additional voltage is applied to the CTF memory device 10. Referring to FIG. 8A, during erase, the control gate 27 may be kept in a state of about 0V, and a higher voltage (for example, $V_{body}$=about 17V~about 18V) may be applied to the substrate 11.

Because the holes are injected into the charge injection regions A having the convex curvature even during erase, degradation of the tunnel insulating layer 21 may be limited to the charge injection regions A. Because the curvature of the threshold voltage determination region B is less than the curvature of the charge injection regions A and the portion of the tunnel insulating layer 21 near the threshold voltage determination region B is thicker than the portions of the tunnel insulating layer 21 near to the charge injection regions A, the electrons may not be directly released from the threshold voltage determination region B having the concave curvature.

According to the erase operation of example embodiments, after the holes are injected in this way, an additional bias voltage having a polarity opposite to that of an erase voltage may be applied to move the holes in the charge trap layer 23 to a portion where a threshold voltage is determined and then remove the electrons. The additional voltage may accelerate the movement of the injected holes. The additional voltage in the erase operation may be a DC or DC plus AC voltage less than that of the erase voltage. Also, the DC polarity of the additional voltage may be opposite to that of the erase voltage. Referring to FIG. 8B, when a lower DC or DC plus AC voltage of about 8V is applied as an additional voltage to the control gate 27, holes may drift into the charge trap layer 23, thereby accelerating the erase operation. For example, when the additional voltage is applied, electrons and holes may be rapidly recombined with each other even during erase.

As described above, the program operation may be performed to be a threshold voltage of a program state by injecting electrons into the CTF memory device 10 and trapping the injected electrons into the trap sites of the charge trap layer 23, and the erase operation may be performed to be a threshold voltage of an erase state by injecting holes into the CTF memory device 10 and removing the electrons due to recombination between the electrons and the holes.

Accordingly, each memory cell has two states, for example, a program state and an erase state. An erase state may be an on state where current flows to a drain connected to a bit line due to a voltage applied to the control gate 27 during a read operation, thereby reducing the threshold voltage of the memory cell, and a program state may be an off state where current may not flow to the drain connected to the bit line due to the voltage applied to the control gate 27 during the read operation by increasing the threshold voltage of the memory cell.

Figure 9:
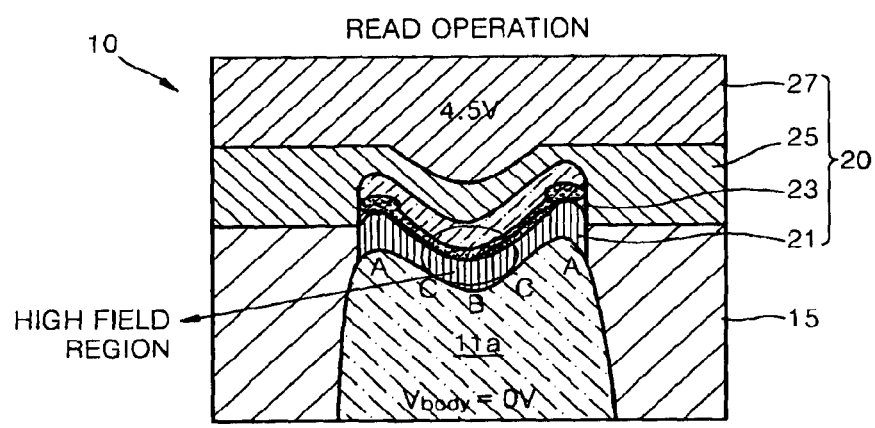

FIG. 9 is illustrating the read operation of the CTF memory device 10 according to example embodiments. Referring to FIG. 9, during read operation, a read voltage of, for example, about 4.5V, may be applied to the control gate 27 and the substrate 11 may be kept in a state of Vbody=0V. Because the density of electrons in the portions of the charge trap layer 23 corresponding to the charge injection regions A is still relatively high, the threshold voltage of the charge injection regions A may be high. Although regions C between the charge injection regions A and the threshold voltage determination region B have an electron density similar to that of the threshold voltage determination region B, because the threshold voltage determination region B is a relatively high gate field region due to the concave curvature, the threshold voltage determination region B may have the lowest threshold voltage.

Because the charge injection regions A, which cause degradation, are separated from the threshold voltage determination region B, a programmed threshold voltage may not shift, thereby improving reliability even during a read operation. In the CTF memory device 10 according to example embodiments, the electron or hole injection regions may change by adding curvature to the channel region 11a, the tunnel insulating layer 21, and the charge trap layer 23. As a result, because the charge injection regions A and the threshold voltage determination region B are separated from each other, a shift in a threshold voltage may be avoided, thereby preventing or reducing reliability degradation of the CTF memory device 10.

In the programming, after the electrons are injected by applying a program bias, when the DC or DC plus AC additional voltage smaller than the program bias is also applied, the electrons may move to the desired positions in the charge trap layer 23, thereby separating the charge injection regions A from the threshold voltage determination region B. In the erase operation, because the DC or DC plus AC additional voltage smaller than the erase bias is applied after the erase bias is applied to inject holes, the holes may move to the position where a threshold voltage is determined to erase the electrons.

Accordingly, when the additional voltage is applied after the charges are injected for programming or erasing, charge stabilization and recombination speed may be improved, the possibility of incomplete recombination may be reduced, the possibility of coexistence of opposite charges may be reduced, the stability of the erase state or program state may be ensured, and the possibility of degradation in dispersion of the threshold voltage in the program or erase may be reduced.

In generation operation of a CTF memory device, during programming, a program operation may be performed by applying a program voltage pulse to a memory cell of the CTF memory device and then a program verify operation may be performed by applying a verify voltage to verify whether the memory cell is programmed. Also, in a programming mode based on an incremental step pulse programming (ISPP) method, a program operation applying a program voltage to the memory cell, and then a program verify operation applying a verify voltage, may be repeatedly performed until the threshold voltage of the memory cell reaches a threshold voltage in a program state.

In erasing, an erase operation may be performed by applying an erase voltage pulse to the memory cell of the CTF memory device, and then an erase verify operation may be performed by applying a verify voltage to confirm whether the memory cell is erased. Accordingly, as the operating method of example embodiments, when charges are injected for program or erase and then an additional voltage is applied, the additional voltage may be applied between a voltage for program or erase and a verify voltage. For example, after a program or an erase is performed by applying a program voltage or an erase voltage and then applying an additional voltage, a verifying operation may be performed by applying a verify voltage. The program voltage, the erase voltage, the additional voltage, and the verify voltage may be applied as pulses as shown in FIGS. 10A through 12B.

Figure 10A:
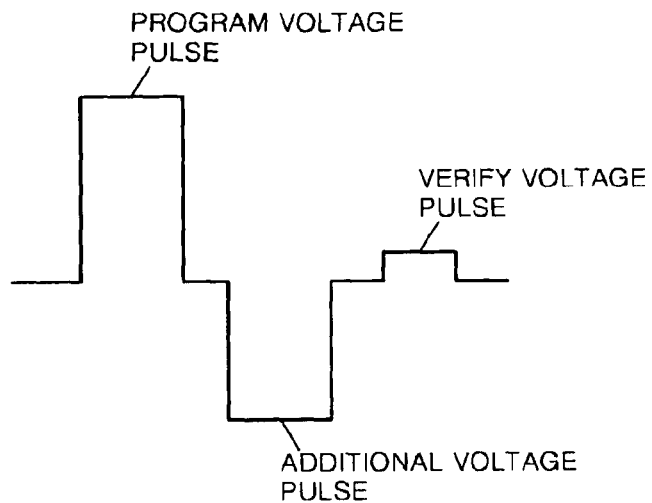
FIGS. 10A and 10B illustrate embodiments of voltage waveforms during programming according to method of operating the flash memory device according to example embodiments.
Figure 10B:
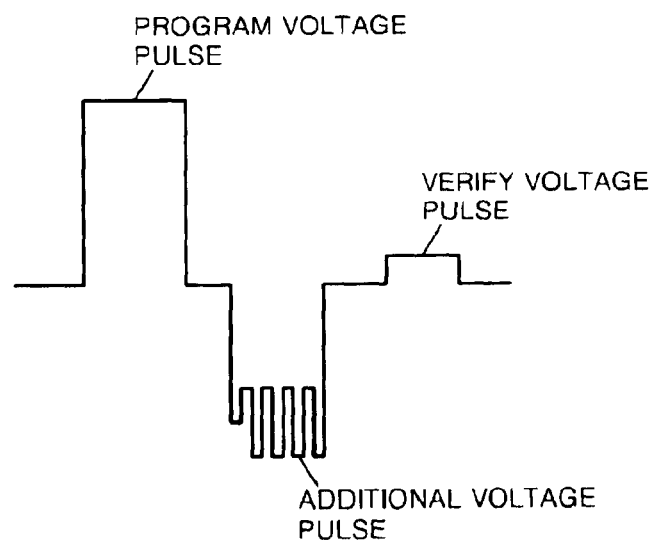

FIGS. 10A and 10B illustrate embodiments of voltage waveforms when the program operation is performed according to an operating method of example embodiments. FIG. 10A illustrates voltage waveform when an additional voltage is a DC voltage having a magnitude less than and a polarity opposite to those of a program voltage. FIG. 10B illustrates voltage waveform when an additional voltage is a DC plus AC voltage having a magnitude smaller than and a DC polarity opposite to that of a program voltage.

Figure 11A:
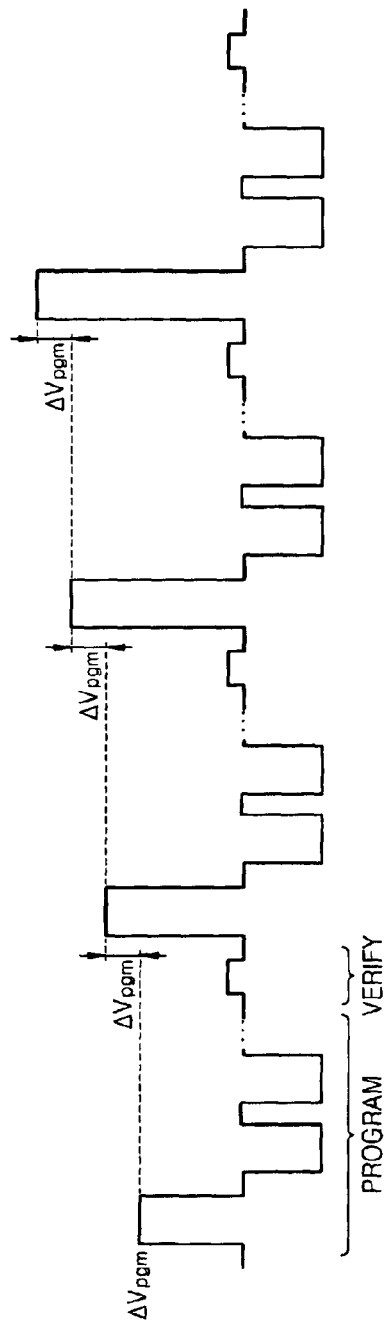
FIGS. 11A and 11B illustrate voltage waveforms during programming based on an incremental step pulse programming (ISPP) method respectively using the voltage waveforms of FIGS. 10A and 10B.
Figure 11B:
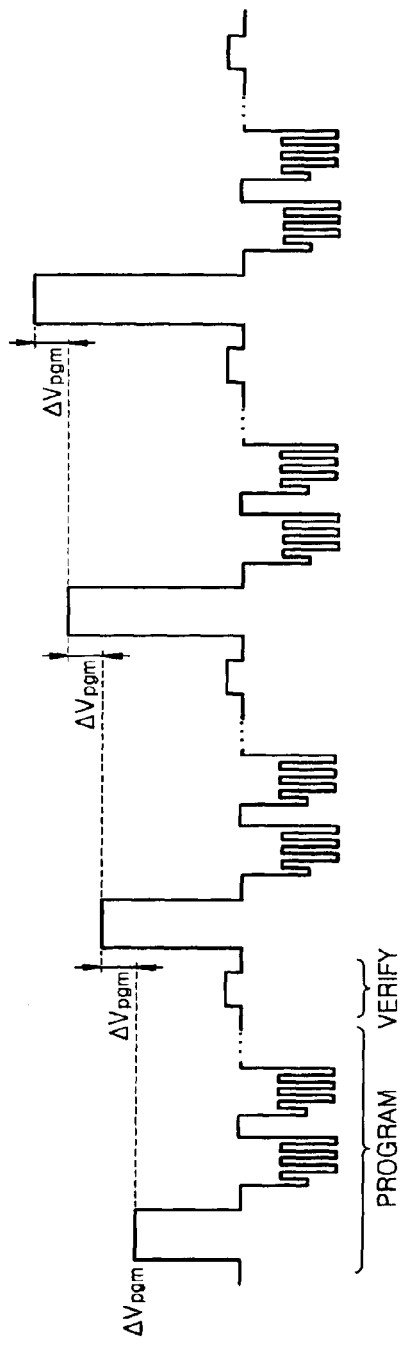

Referring to FIGS. 10A and 10B, during programming, a program voltage, an additional voltage, and a verify voltage are sequentially applied while forming one package. FIGS. 11A and 11B illustrate voltage waveforms when a program operation based on an ISPP method respectively using the voltage waveforms of FIGS. 10A and 10B are performed. As may be seen from FIGS. 11A and 11B, the operation method according to example embodiments may be applied to the program operation based on the ISPP method. In FIGS. 11A and 11B, Vpgm denotes the magnitude of a basic program voltage during the program operation based on the ISPP method and ΔVpgm denotes the increased amount of the program voltage during the program operation based on the ISPP method.

When the operation method according to example embodiments is applied to the program operation based on the ISPP method, a program voltage pulse having a predetermined or given magnitude may be applied to perform a program operation, an additional voltage pulse may be applied, and then a verify voltage pulse may be applied to confirm whether a threshold voltage reaches a threshold voltage in a program state. When it is confirmed that the threshold voltage has not reached a threshold voltage of the program state, the magnitude of the program voltage pulse may be increased by a predetermined or given level and the above process may be repeated. This process may be repeated several times until the threshold voltage reaches the threshold voltage of the program state.

Figure 12A:
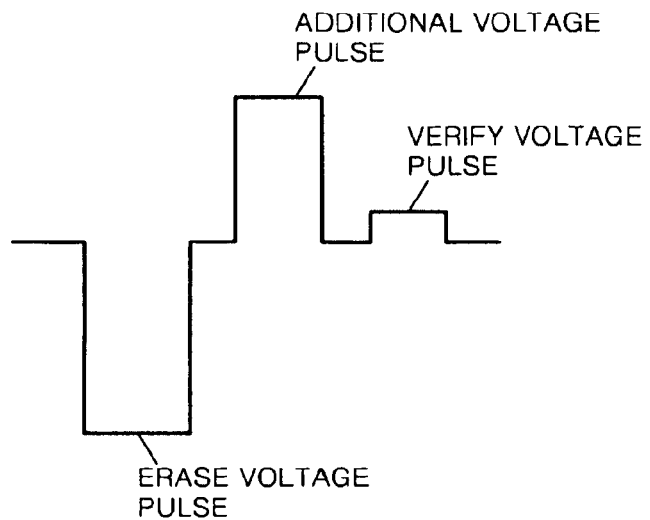
FIGS. 12A and 12B illustrate embodiments of voltage waveforms during erasing according to method of operating the flash memory device according to example embodiments.
Figure 12B:
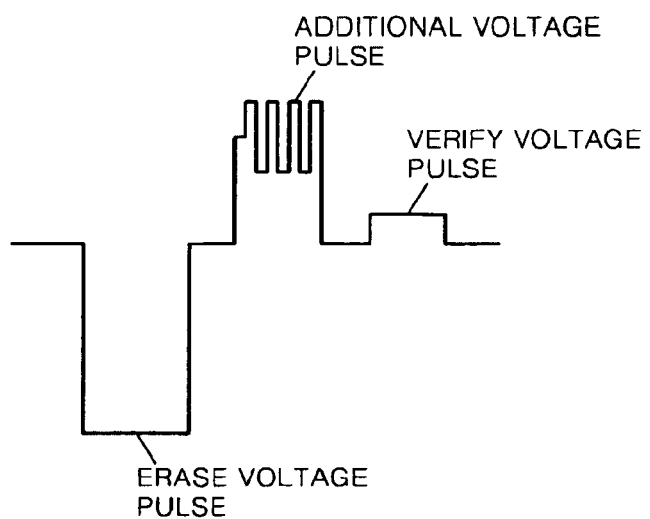

FIGS. 12A and 12B illustrate embodiments of voltage waveforms when the erase operation is performed according to an operating method of example embodiments. FIG. 12A illustrates voltage waveform when an additional voltage is a DC voltage having a magnitude less than and a polarity opposite to those of an erase voltage. FIG. 12B illustrates voltage waveform when an additional voltage is a DC plus AC voltage having a magnitude less than and a DC polarity opposite to those of an erase voltage. Referring to FIGS. 12A and 12B, during erase, an erase voltage, an additional voltage, and a verify voltage may be sequentially applied while forming a package.

FIGS. 13A-13K are cross-sectional views illustrating a method of manufacturing a CTF memory device according to example embodiments.

Referring to FIGS. 13A through 13I, a substrate 11 may be prepared. The substrate 11 may be a silicon semiconductor substrate, or a substrate obtained by forming a single crystal silicon layer on an SOI substrate. A structure including a protrusion portion 33 formed on a preliminary channel region position of the substrate 11 and having an upper end whose first and second protrusions 33a and 33b are spaced apart from each other, and insulating material regions 15' formed on both sides of the protrusion portion 33 to expose the first and second protrusions 33a and 33b may be formed on the substrate 11.

Figure 13A:
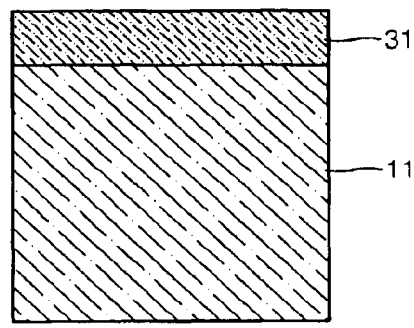
Figure 13B:
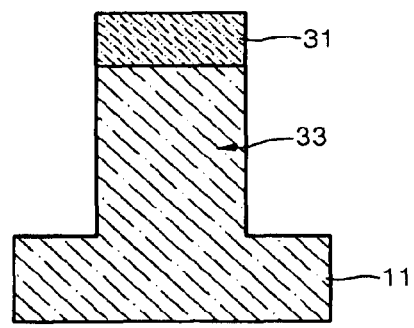
Figure 13C:
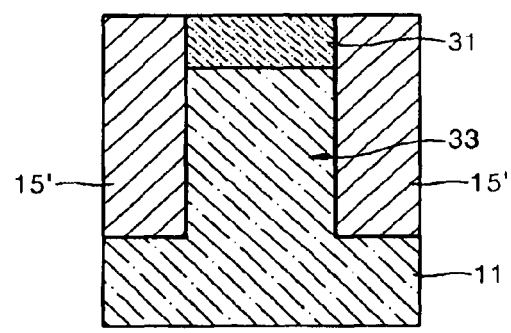
Figure 13D:
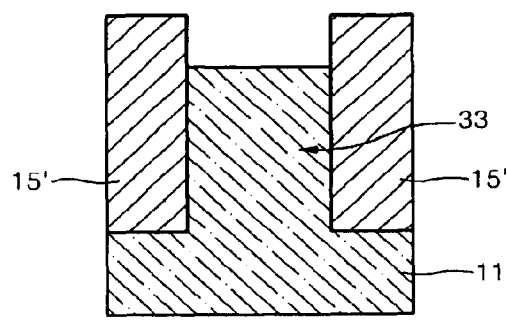
Figure 13E:
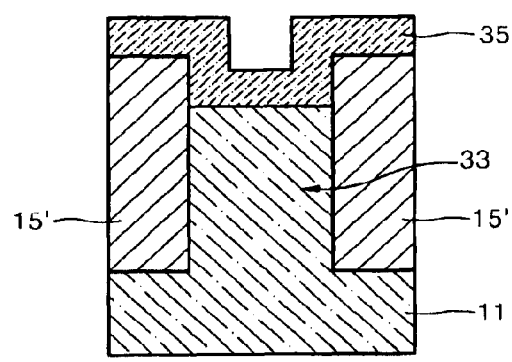
Figure 13F:
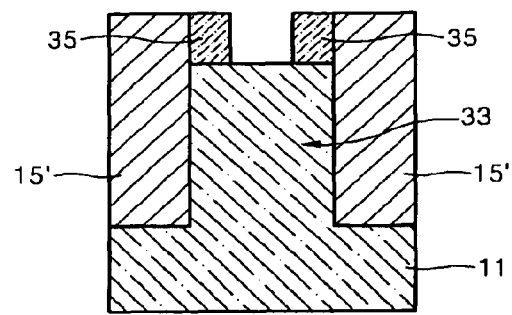
Figure 13G:
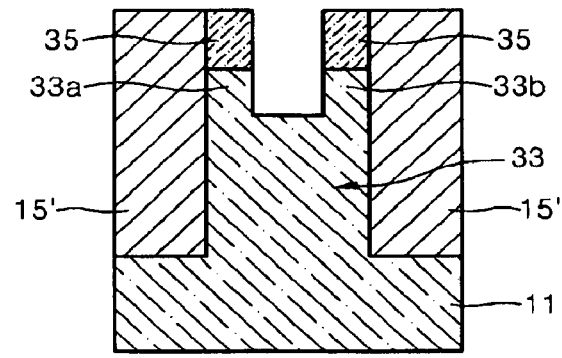
Figure 13H:
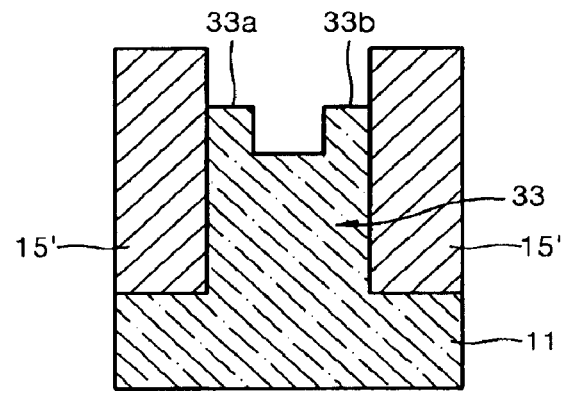
Figure 13I:
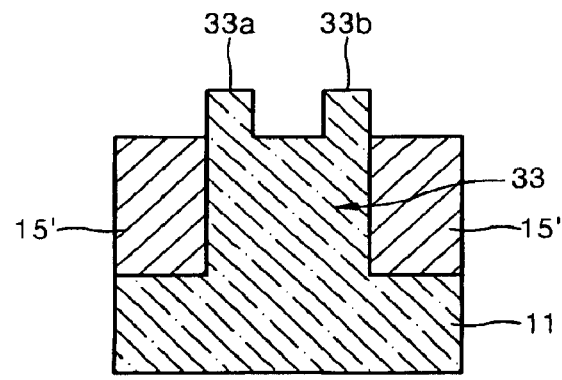
Figure 13J:
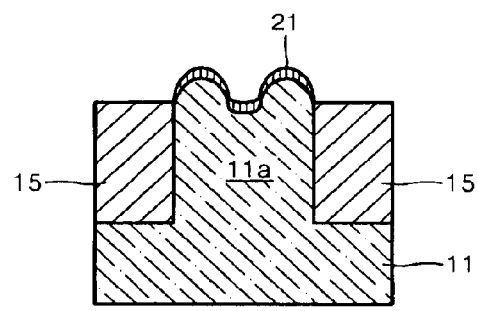
Figure 13K:
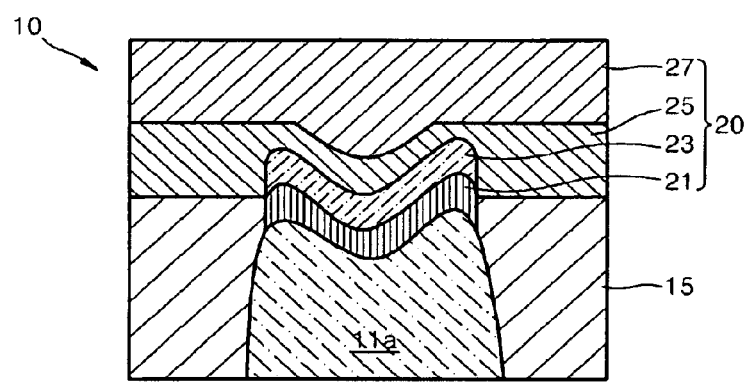

Etching may be performed so that the first and second protrusions 33a and 33b may have a convex curvature as shown in FIG. 13J. Accordingly, a channel region 11a having an upper end whose lateral portions have a convex curvature may be formed. A gate structure 20 may be formed on the channel region 11a as shown in FIGS. 13J and 13K. At least a tunnel insulating layer 21 and a charge trap layer 23 may be formed to conform to the curved shape of the channel region 11a.

The structure including the protrusion portion 33 and the insulating material regions 15' may be formed by processes of FIGS. 13A-13D such that a stepped structure having the protrusion 33 and the insulating material regions 15' extending beyond the protrusion portion 33 may be formed on the substrate 11. In order to form the stepped structure, referring to FIG. 13A, a hard mask layer 31 may be formed on the substrate 11. Referring to FIG. 13B, portions of the hard mask layer 31 and the substrate 11 other than the preliminary channel region position may be removed to a predetermined or given depth to form the protrusion portion 33. The hard mask layer 31 may be a nitride layer, for example, a $Si_3N_4$ layer. Referring to FIG. 13C, the insulating material regions 15' may be formed on both sides of the protrusion portion 33 to extend beyond the protrusion portion 33. The insulating material regions 15' may extend up to the height of the hard mask layer 31. Referring to FIG. 13D, the hard mask layer 31 may be removed to expose the stepped structure.

The insulating material regions 15' may be formed of an oxide. When memory cells of the CTF memory device 10 according to example embodiments may be electrically separated from one another by STI, the insulating material regions 15' may correspond to device isolating region 15 by STI process. A hard mask layer 35 may be formed on only portions of the protrusion portion 33 adjacent to the insulating material regions 15' to expose a central portion of the protrusion portion 33 as shown in FIGS. 13E and 13F. Referring to FIG. 13E, the hard mask layer 35 may be formed on the entire surface of the stepped structure. Referring to FIG. 13F, etching may be performed so that the hard mask layer 35 may be left on only the portions of the protrusion portion 33 adjacent to the insulating material regions 15' and the central portion of the protrusion portion 33 may be exposed.

Referring to FIG. 13G, the exposed central portion at an upper end of the protrusion portion 33 may be etched to a predetermined or given depth using the hard mask layer 35 as a mask to obtain the first and second protrusions 33a and 33b which are spaced apart from each other. Referring to FIG. 13H, the hard mask layer 35 may be removed. Referring to FIG. 13I, the insulating material regions 15' may be partially removed to expose outer surfaces of the first and second protrusions 33a and 33b.

Referring to FIG. 13J, etching may be performed so that the first and second protrusions 33a and 33b may have a convex curvature and a space between the first and second protrusions 33a and 33b may have a concave curvature. A tunnel insulating layer 21 may be formed on the channel region 11a having the curved shape. Referring to FIG. 13K, a charge trap layer 23, a blocking insulating layer 25, and a control gate 27 may be formed on the tunnel insulating layer 21, thereby completing a CTF memory device 10 according to example embodiments.

Although the method of manufacturing the CTF memory device 10 has been explained with reference to FIGS. 13A-13K, the method of manufacturing according to example embodiments may not be limited thereto and various modifications may be made within the scope of example embodiments. Although a technology of spatially separating a charge injection region from a threshold voltage determination region is applied to a CTF memory device in the above description, example embodiments may not be limited thereto.

Therefore, the technology of example embodiments may be applied to other memory devices, for example, a floating gate type flash memory device including a floating gate and a control gate as well as to the CTF memory device 10. Because the application of this technology to the floating gate type flash memory device is obvious to one of ordinary skill in the art from the above description and well-known fact, a detailed explanation thereof will not be given.

As described above, according to example embodiments, a charge injection region and a threshold voltage determination region may be separate from each other. Accordingly, reliability degradation resulting from a shift in a threshold voltage due to degradation of a tunnel insulating layer (oxide layer) of a region into which electrons or holes are injected during programming or erasing may be overcome.

Furthermore, during the program or erasure operation of the flash memory device according to example embodiments, because an additional voltage is applied after a program or erase voltage is applied to inject charges, charge stabilization and recombination speed may be increased, the possibility of incomplete recombination may be reduced, the possibility of coexistence with opposite charges may be reduced, the stability of an erase or program state may be ensured, and the possibility of degradation due to a shift in a threshold voltage in a program or erase may be reduced.

While example embodiments have been particularly shown and described with reference to example embodiments thereof, it will be understood by those of ordinary skill in the art that various changes in form and details may be made therein without departing from the spirit and scope of the following claims.

What is claimed is:

1. A memory device comprising:
a channel region having an upper end where both sides of the upper end are curved, the curved portions of both sides allowing charges to be injected thereinto in a program or erase voltage such that the curved portions into which the charges are injected are separate from a center portion which determines a threshold voltage; and
a gate structure on the channel region.

2. The memory device of claim 1, wherein the upper end of the channel region is formed to have a convex curvature on both sides.

3. The memory device of claim 2, wherein the upper end of the channel region is further formed to have a concave curvature in the center.

4. The memory device of claim 3, wherein curvatures of portions having the convex curvature are greater than a portion having the concave curvature.

5. The memory device of claim 4, wherein the gate structure includes a tunnel insulating layer, and
wherein the tunnel insulating layer has a portion near the concave curvature thicker than portions near the convex curvature.

6. The memory device of claim 1, wherein at least some layers constituting the gate structure are formed to conform to the curved shape of the channel region.

7. The memory device of claim 6, wherein the gate structure is of a charge trap type comprising:
a tunnel insulating layer and a charge trap layer on the channel region to conform to the curved shape of the channel region;
a blocking insulating layer on the charge trap layer; and
a control gate on the blocking insulating layer.

8. A method of manufacturing a memory device, the method comprising:
preparing a substrate;
forming a structure including a protrusion portion formed on a preliminary channel region position on the substrate and having first and second protrusions being spaced apart from each other in an upper end of the protrusion portion, and insulating material regions formed on both sides of the protrusion portion to expose the first and second protrusions;
forming a channel region having an upper end;
etching both sides of the upper end so that the first and second protrusions have a convex curvature; and
forming a gate structure on the channel region.

9. The method of claim 8, wherein forming the structure including the protrusion portion and the insulating material regions comprises:
forming a stepped structure on the substrate including a protrusion portion and insulating material regions which are on both sides of the protrusion portion and extend beyond the protrusion portion;
etching a first hard mask layer on portions of the protrusion portion adjacent to the insulating material regions, and exposing only a central portion of the protrusion portion;
forming first and second protrusions spaced apart from each other on an upper end of the protrusion portion by etching the exposed central portion of the protrusion portion to a depth; and
removing the first hard mask layer, and partially removing the insulating material regions to expose outer surfaces of the first and second protrusions.

10. The method of claim 9, wherein forming the stepped structure comprises:
forming a second hard mask layer on the substrate;
forming the protrusion portion by removing portions of the second hard mask layer and the substrate other than the preliminary channel region position to a depth;
forming an insulating material region on both sides of the protrusion portion so that the insulting material region extends beyond the protrusion portion to obtain a stepped structure; and
exposing the stepped structure by removing the second hard mask layer.

11. The method of claim 9, wherein etching the first hard mask layer comprises:
forming a first hard mask layer on the stepped structure; and
etching the first hard mask layer only on portions of the protrusion portion other than those adjacent to the insulating material regions.

12. The method of claim 8, wherein the upper end of the channel region is further formed to have a concave curvature in center.

13. The method of claim 12, wherein a curvature of the convex curvature is greater than a curvature of the concave curvature.

14. The method of claim 13, wherein forming the gate structure includes forming a tunnel insulating layer,
   wherein the tunnel insulating layer has a portion near the concave curvature thicker than portions near the convex curvature.

15. The method of claim 8, wherein forming the gate structure includes forming a plurality of layers,
   wherein at least some of the plurality of layers constituting the gate structure are formed to conform to the curved shape of the channel region.

16. The method of claim 15, wherein forming the gate structure includes forming a charge trap type gate structure comprising:
   forming a tunnel insulating layer and a charge trap layer on the channel region to conform to the curved shape of the channel region;
   forming a blocking insulating layer on the charge trap layer; and
   forming a control gate on the blocking insulating layer.

17. A method of operating a memory device, the method comprising:
   injecting charges into a channel region having an upper end where both sides of the upper end are curved by applying a program or erase voltage; and
   accelerating the movement of the injected charges by applying an additional voltage.

18. The method of claim 17, wherein the upper end of the channel region of the memory device is formed to have a convex curvature in both sides and a concave curvature in the center, and wherein the convex curvature has a curvature greater than the concave curvature.

19. The method of claim 18, wherein the additional voltage is a direct current (DC) voltage or a direct current plus alternating current (DC plus AC) voltage.

20. The method of claim 19, wherein the additional voltage has a magnitude less than that of the program or erase voltage.

21. The method of claim 19, wherein the additional voltage has a DC polarity opposite to that of the program or erase voltage.

22. The method of claim 17, wherein the additional voltage is a DC voltage or a DC plus AC voltage.

23. The method of claim 22, wherein the additional voltage has a magnitude smaller than that of the program or erase voltage.

24. The method of claim 22, wherein the additional voltage has a DC polarity opposite to that of the program or erase voltage.

* * * * *